United States Patent
Choi et al.

(10) Patent No.: US 11,809,044 B2
(45) Date of Patent: Nov. 7, 2023

(54) LIQUID CRYSTAL PHASE DIFFERENCE FILM, POLARIZING PLATE FOR LIGHT-EMITTING DISPLAY DEVICE INCLUDING SAME, AND LIGHT-EMITTING DISPLAY DEVICE INCLUDING SAME

(71) Applicant: SAMSUNG SDI CO., LTD., Yongin-si (KR)

(72) Inventors: Jin Hee Choi, Suwon-si (KR); Jin Sook Kim, Suwon-si (KR); Jung Hun You, Suwon-si (KR); Sun Hong Park, Suwon-si (KR); Sang Hum Lee, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 677 days.

(21) Appl. No.: 16/756,438

(22) PCT Filed: Sep. 11, 2018

(86) PCT No.: PCT/KR2018/010579
§ 371 (c)(1),
(2) Date: Apr. 15, 2020

(87) PCT Pub. No.: WO2019/083160
PCT Pub. Date: May 2, 2019

(65) Prior Publication Data
US 2020/0285093 A1   Sep. 10, 2020

(30) Foreign Application Priority Data

Oct. 23, 2017 (KR) .................. 10-2017-0137783

(51) Int. Cl.
*G02F 1/13363* (2006.01)
*G02F 1/1337* (2006.01)
*G02F 1/1335* (2006.01)

(52) U.S. Cl.
CPC ........ *G02F 1/13363* (2013.01); *G02F 1/1337* (2013.01); *G02F 1/133528* (2013.01);
(Continued)

(58) Field of Classification Search
CPC .......... B29D 11/00644; B32B 2457/20; B32B 2457/202; C09K 2323/03;
(Continued)

(56) References Cited

U.S. PATENT DOCUMENTS

| | | | |
|---|---|---|---|
| 7,359,018 B2 | 4/2008 | Kashima | |
| 2009/0068472 A1* | 3/2009 | Umemoto | G02B 5/3016 156/247 |

(Continued)

FOREIGN PATENT DOCUMENTS

| | | |
|---|---|---|
| CN | 102243330 A | 11/2011 |
| CN | 102576108 A | 7/2012 |

(Continued)

OTHER PUBLICATIONS

Chinese Office Action in corresponding Chinese Patent Application No. 201880068756.6, Chinese Office Action dated Jun. 30, 2021 (10 pgs.).

(Continued)

*Primary Examiner* — Eli D. Strah
(74) *Attorney, Agent, or Firm* — Lewis Roca Rothgerber Christie LLP

(57) ABSTRACT

A liquid crystal retardation film, a polarizing plate for light emitting displays including the same, and a light emitting display including the same are provided. The liquid crystal retardation film includes: a first retardation layer having no alignment layer, a UV absorbent primer layer, and a second retardation layer sequentially formed in the stated order, wherein each of the first retardation layer and the second retardation layer may be a liquid crystal layer.

20 Claims, 2 Drawing Sheets

(52) U.S. Cl.
CPC ..... *B32B 2457/20* (2013.01); *B32B 2457/202* (2013.01); *C09K 2323/03* (2020.08); *C09K 2323/031* (2020.08); *C09K 2323/035* (2020.08); *G02F 1/133742* (2021.01); *G02F 2201/086* (2013.01); *G02F 2202/40* (2013.01)

(58) Field of Classification Search
CPC ........ C09K 2323/031; C09K 2323/035; G02B 5/30; G02B 5/3033; G02B 5/3075; G02B 5/3083; G02F 1/133528; G02F 1/13363; G02F 1/133635; G02F 1/1337; G02F 1/133742; G02F 2201/086; G02F 2201/38; G02F 2202/40; H01L 27/32; H01L 27/3232; H01L 51/52; H01L 51/5293

See application file for complete search history.

(56) References Cited

U.S. PATENT DOCUMENTS

| | | | |
|---|---|---|---|
| 2016/0018564 A1* | 1/2016 | Shin | G02B 5/3083 428/1.31 |
| 2017/0184766 A1* | 6/2017 | Ozawa | C08F 2/50 |

FOREIGN PATENT DOCUMENTS

| | | | | |
|---|---|---|---|---|
| CN | 103857751 A | 6/2014 | | |
| CN | 104345372 A | 2/2015 | | |
| CN | 105431752 A | 3/2016 | | |
| JP | 2008-9346 A | 1/2008 | | |
| JP | 2011-59663 A | 3/2011 | | |
| JP | 2014-32270 A | 2/2014 | | |
| KR | 10-2005-0008646 A | 1/2005 | | |
| KR | 10-2007-0104622 A | 10/2007 | | |
| KR | 10-2012-0055129 A | 5/2012 | | |
| KR | 10-2013-0018594 A | 2/2013 | | |
| KR | 10-2013-0071446 A | 6/2013 | | |
| KR | 10-2015-0015158 A | 2/2015 | | |
| TW | 201736473 | 10/2017 | | |
| WO | WO-2014073616 A1 * | 5/2014 | ........... | G02B 5/3016 |
| WO | WO-2015016456 A1 * | 2/2015 | ............... | G02B 5/30 |
| WO | WO-2017142184 A1 * | 8/2017 | ............... | B32B 7/12 |

OTHER PUBLICATIONS

International Search of PCT/KR2018/010579, dated Dec. 14, 2018, 5 pages.

* cited by examiner

[FIG. 1]
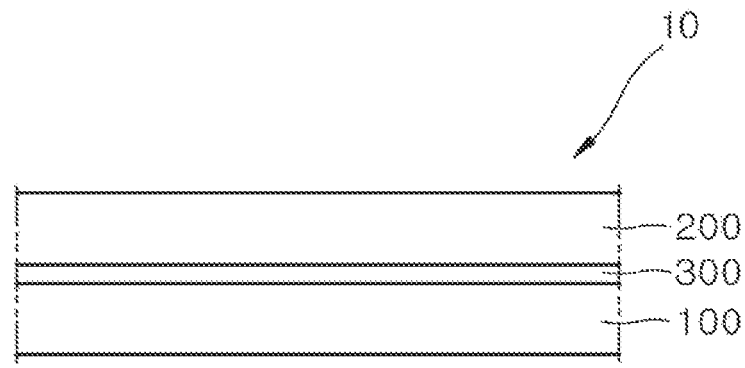
[FIG. 2]
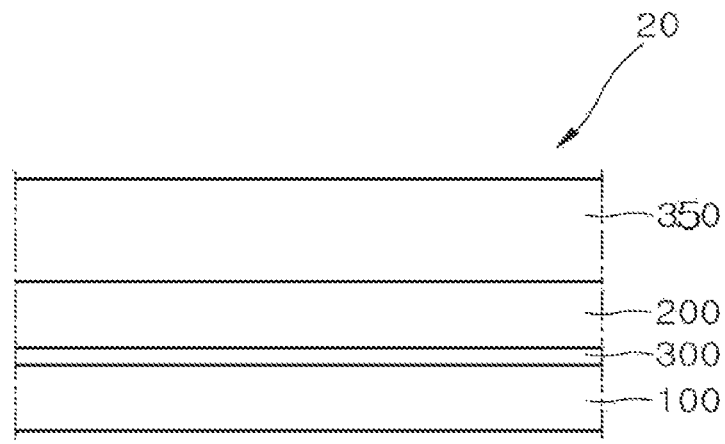
[FIG. 3]
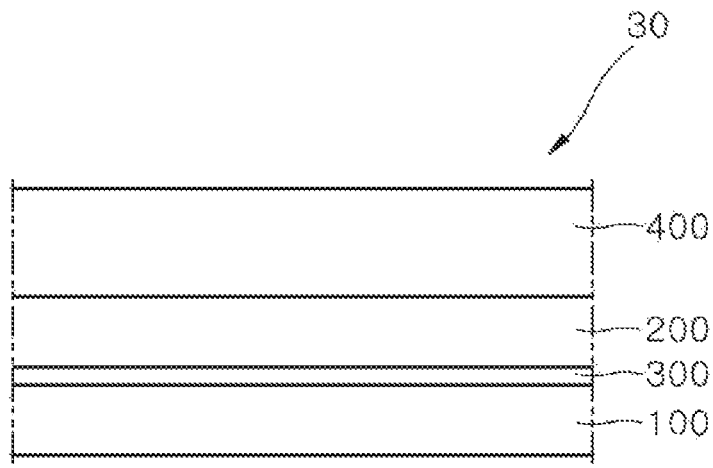

[FIG. 4]
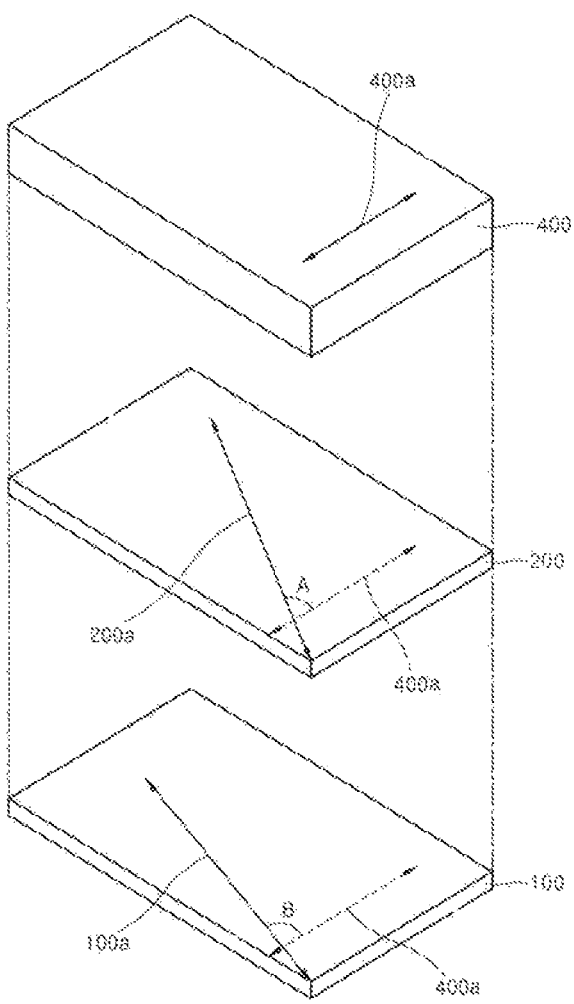

LIQUID CRYSTAL PHASE DIFFERENCE FILM, POLARIZING PLATE FOR LIGHT-EMITTING DISPLAY DEVICE INCLUDING SAME, AND LIGHT-EMITTING DISPLAY DEVICE INCLUDING SAME

CROSS-REFERENCE TO RELATED APPLICATIONS

This application is a U.S. National Phase Patent Application of International Application Number PCT/KR2018/010579, filed on Sep. 11, 2018, which claims priority to Korean Patent Application Number 10-2017-0137783, filed on Oct. 23, 2017, the entire contents of both of which are incorporated herein by reference.

TECHNICAL FIELD

The present invention relates to a liquid crystal retardation film, a polarizing plate for light emitting displays including the same, and a light emitting display including the same.

BACKGROUND ART

An organic light emitting display is a self-emissive type display and includes organic light emitting diodes configured to emit red, green and blue light. The organic light emitting display allows external light to be reflected by display diodes disposed inside an organic light emitting diode panel. The reflected external light is mixed with light emitted from the organic light emitting diodes, thereby causing deterioration in visibility when viewed from the outside. In order to solve this problem, the organic light emitting display is provided with a polarizing film and a retardation film to prevent external light having entered the organic light emitting display from exiting the organic light emitting display through linear polarization and circular polarization of the external light.

Although a polymer film can be used as the retardation film, it has been continuously attempted in recent years to form a liquid crystal retardation layer in view of slimness of the polarizing plate and the organic light emitting diode display. Generally, alignment of a liquid crystal compound is performed by aligning liquid crystals in an alignment layer, followed by securing the liquid crystals through heat or crosslinking reaction. As the alignment layer, a photopolymerizable alignment layer or an alignment layer subjected to rubbing treatment can be considered. However, the alignment layer can increase the thickness of the polarizing plate by the thickness thereof and can complicate a process of manufacturing the polarizing plate. In recent years, a method of forming a retardation layer through alignment of liquid crystals without the alignment layer has been considered. However, when the liquid crystals are aligned without the alignment layer, alignment of the liquid crystals can be disrupted upon exposure to UV light for a long period of time, thereby causing deterioration in reliability of the retardation film.

The background technique of the present invention is disclosed in Japanese Unexamined Patent Publication No. 2014-032270.

DISCLOSURE

Technical Problem

It is one object of the present invention to provide a liquid crystal retardation film that can secure high adhesive strength between a first liquid crystal layer having no alignment layer and a second liquid crystal layer.

It is another object of the present invention to provide a liquid crystal retardation film that includes a first liquid crystal layer having no alignment layer and a second liquid crystal layer and can secure high adhesive strength between the first liquid crystal layer and the second liquid crystal layer to improve reliability in light resistance even after UV irradiation for a long period of time.

It is a further object of the present invention to provide a liquid crystal retardation film that includes a first liquid crystal layer having no alignment layer and a second liquid crystal layer and can secure a low retardation variation rate of the first liquid crystal layer to improve reliability in light resistance even after UV irradiation for a long period of time.

It is yet another object of the present invention to provide a liquid crystal retardation film that has good flatness.

It is yet another object of the present invention to provide a liquid crystal retardation film capable of reducing reflectance both at the front and the side thereof.

It is yet another object of the present invention to provide a polarizing plate for light emitting displays that includes the liquid crystal retardation film according to the present invention.

It is yet another object of the present invention to provide a light emitting display that includes the polarizing plate for light emitting displays according to the present invention.

Technical Solution

In accordance with one aspect of the present invention, a liquid crystal retardation film includes: a first retardation layer having no alignment layer; a UV absorbent primer layer; and a second retardation layer sequentially formed in the stated order, wherein each of the first retardation layer and the second retardation layer may be a liquid crystal layer.

The UV absorbent primer layer may include a UV absorber-containing primer layer.

The UV absorbent primer layer may be directly formed on each of the first retardation layer and the second retardation layer.

The liquid crystal layer of the first retardation layer may include a liquid crystal layer including liquid crystals having a photosensitive reaction group.

The liquid crystal layer of the second retardation layer may include a liquid crystal layer including liquid crystals having a photosensitive reaction group.

The second retardation layer may have a higher crosslinking degree of the liquid crystals having a photosensitive reaction group than the first retardation layer.

The first retardation layer may have an in-plane retardation Re of about 90 nm to about 170 nm at a wavelength of 550 nm and the second retardation layer may have an in-plane retardation Re of about 210 nm to about 280 nm at a wavelength of 550 nm.

An angle defined between a fast axis of the second retardation layer and a fast axis of the first retardation layer may be about 55° to about 80°.

The liquid crystals of the first retardation layer may be nematic liquid crystals aligned in homeotropic alignment.

The liquid crystals of the second retardation layer may be discotic liquid crystals or nematic liquid crystals aligned in homeotropic alignment.

The UV absorber may include at least one of benzotriazole, hydroxyphenyltriazine, triazine, and phenyltriazine based UV absorbers.

The UV absorbent primer layer may have a thickness of about 5 μm or less.

The UV absorber may be present in an amount of about 10% by weight (wt %) to about 30 wt % in the UV absorber-containing primer layer.

Each of the liquid crystal layers of the first and second retardation layers may include a photosensitive group, and the photosensitive group may include at least one of a cinnamoyl group, a cinnamylidene group, a (meth)acryloyl group, a (meth)acryloyl group-containing group, a coumarin group, and a benzophenone group.

The liquid crystal retardation film may have a retardation variation rate of about 3% or less, as calculated by Equation 1.

Retardation variation rate=|B−A|/A×100,   <Equation 1> where A and B are the same as defined in the following detailed description.

The UV absorbent primer layer may be non-adhesive.

The liquid crystal layer of the second retardation layer may include liquid crystals having an alignment not changed by UV irradiation.

In accordance with another aspect of the present invention, a polarizing plate for light emitting displays may include a polarizing film and the liquid crystal retardation film according to the present invention, the liquid crystal retardation film being formed on one surface of the polarizing film.

In accordance with a further aspect of the present invention, a light emitting display may include the polarizing plate for light emitting displays according to the present invention.

Advantageous Effects

The present invention provides a liquid crystal retardation film that can secure high adhesive strength between a first liquid crystal layer having no alignment layer and a second liquid crystal layer.

The present invention provides a liquid crystal retardation film that includes a first liquid crystal layer having no alignment layer and a second liquid crystal layer and can secure high adhesive strength between the first liquid crystal layer and the second liquid crystal layer to improve reliability in light resistance even after UV irradiation for a long period of time.

The present invention provides a liquid crystal retardation film that includes a first liquid crystal layer having no alignment layer and a second liquid crystal layer and can secure a low retardation variation rate of the first liquid crystal layer to improve reliability in light resistance even after UV irradiation for a long period of time.

The present invention provides a liquid crystal retardation film that has good flatness.

The present invention provides a liquid crystal retardation film capable of reducing reflectance both at the front and the side thereof.

The present invention provides a polarizing plate for light emitting displays including the liquid crystal retardation film according to the present invention.

The present invention provides a light emitting display including the polarizing plate for light emitting displays according to the present invention.

DESCRIPTION OF DRAWINGS

FIG. 1 is a sectional view of a liquid crystal retardation film according to one embodiment of the present invention.

FIG. 2 is a sectional view of a liquid crystal retardation film according to another embodiment of the present invention.

FIG. 3 is a sectional view of a polarizing plate for light emitting displays according to one embodiment of the present invention.

FIG. 4 is a diagram showing angles between an absorption axis of a polarizing film, a fast axis of a second retardation layer, and a fast axis of a first retardation layer in the polarizing plate for light emitting displays shown in FIG. 3.

BEST MODE

Embodiments of the present invention will be described in detail with reference to the accompanying drawings to provide thorough understanding of the invention to a person having ordinary knowledge in the art to which the present invention pertains. It should be understood that the present invention may be embodied in different ways and is not limited to the following embodiments. In the drawings, portions irrelevant to the description will be omitted for clarity. Like components will be denoted by like reference numerals throughout the specification.

As used herein, spatially relative terms such as "upper" and "lower" are defined with reference to the accompanying drawings. Thus, it will be understood that "upper" can be used interchangeably with "lower".

Herein, "in-plane retardation Re", "out-of-plane retardation Rth", and "degree of biaxiality NZ" are represented by Equations A, B and C, respectively, and are measured at a wavelength of 550 nm.

$Re=(nx-ny) \times d$   <Equation A>

$Rth=((nx+ny)/2-nz) \times d$   <Equation B>

$NZ=(nx-nz)/(nx-ny)$   <Equation C>

(In Equations A, B and C, nx, ny, and nz are indexes of refraction of the retardation layer at a wavelength of 550 nm in the x-axis, y-axis and z-axis directions, respectively, and d is the thickness of the retardation layer (unit: nm).)

Herein, the "side" refers to a region in which θ ranges from 0° to 90° in the spherical coordinate system represented by (φ, θ) in which the front is indicated by (0°, 0°), a left end point is indicated by (180°, 90°), and a right end point is indicated by (0°, 90°) with reference to the horizontal direction.

Hereinafter, a liquid crystal retardation film according to one embodiment of the present invention will be described with reference to FIG. 1.

Referring to FIG. 1, a liquid crystal retardation film 10 may include a first retardation layer 100, a UV absorber-containing primer layer 300, and a second retardation layer 200. The UV absorber-containing primer layer 300 and the second retardation layer 200 are sequentially stacked on an upper surface of the first retardation layer 100.

The UV absorber-containing primer layer 300 is directly formed on one surface of the first retardation layer 100. Herein, the expression "directly formed" means that a certain adhesive layer, bonding layer or adhesive/bonding layer is not interposed between the first retardation layer and the UV absorber-containing primer layer.

The first retardation layer 100 can exhibit a certain range of retardation through alignment of liquid crystals without an alignment layer. With this structure, the polarizing plate can have a slim structure. However, since the first retardation layer 100 is formed without the alignment layer, the liquid crystals are aligned through UV irradiation, thereby causing variation in retardation. However, it is possible to improve reliability by preventing variation in alignment of the liquid crystals using the UV absorber-containing primer layer 300, as described below.

The first retardation layer 100 may include a liquid crystal layer formed of photoreactive liquid crystals having a photosensitive reaction group. Specifically, the first retardation layer is composed of a crosslinked product of liquid crystals having a photosensitive reaction group. As a result, the first retardation layer can exhibit retardation through photoreaction after alignment of liquid crystals without the alignment layer.

The liquid crystals may include a liquid crystalline polymer composed of a unit of a mesogen formation group and a photosensitive group. The liquid crystalline polymer may have the unit composed of the mesogen formation group and the photosensitive group in a main chain or in a side chain. Preferably, the liquid crystalline polymer may include the unit having the mesogen formation group and the photosensitive group through polymerization of a monomer having a polymerization group to the mesogen formation group and the photosensitive group. The polymerization group may include an acryloyl group, a methacryloyl group, an epoxy group, a vinyl ether group, and the like.

The mesogen formation group may be selected from any mesogen formation groups capable of imparting liquid crystallinity to the liquid crystalline polymer. The mesogen formation group may include not only a mesogen group but also a hydrogen bondable mesogen group that can exhibit liquid crystallinity only through hydrogen bonding between molecules.

The mesogen group may include an —Ar1-Y-Ar2- group (where Ar1 and Ar2 are each independently a substituted or unsubstituted $C_6$ to $C_{20}$ arylene group or a substituted or unsubstituted $C_4$ to $C_{20}$ heteroarylene group, and Y includes a single bond, a $C_1$ to $C_3$ alkylene group, —CH=CH—, —C≡C—, —O—, —N=N—, —COO—, —OCO—, —CH=N—, or a $C_6$ to $C_{10}$ arylene group). Ar1 and Ar2 may be aligned in any direction so long as Ar1 and Ar2 can impart liquid crystallinity. If Ar1 and Ar2 are phenylene groups, it is desirable that Ar1 and Ar2 be disposed in para-arrangement, and if Ar1 and Ar2 are naphthalene groups, it is desirable that Ar1 and Ar2 be disposed in 2,6-arrangement.

The photosensitive group is a functional group capable of being crosslinked by photo energy, and may include, for example, a cinnamoyl group, a cinnamylidene group, a (meth)acryloyl group, a (meth)acryloyl group-containing group, a coumarin group, and a benzophenone group. The (meth)acryloyl group-containing group may be a furyl (meth)acryloyl group, a biphenyl (meth)acryloyl group, or a naphtyl (meth)acryloyl group.

In the unit described above, the mesogen formation group may be coupled to the photosensitive group through direct bonding or through a linking group. Examples of the linking group may include a $C_1$ to $C_{10}$ alkylene group, —O—, —S—, —SO—, —SO$_2$—, —CH=CH—, —C≡C—, —N=N—, —COO—, or —OCO—. These linking groups may be used alone or in combination thereof.

In one embodiment, the unit may be coupled to a side chain of the liquid crystalline polymer and may be represented by Formula 1 or Formula 2.

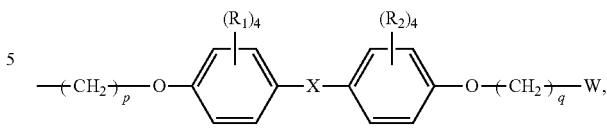

<Formula 1> where p is an integer of 1 to 12; q is an integer of 0 to 12; X is a single bond, a $C_1$ to $C_{10}$ alkylene group, —O—, —S—, —SO—, —SO$_2$—, —CH=CH—, —C≡C—, —N=N—, —COO—, or —OCO—; $R_1$ and $R_2$ are each independently a hydrogen atom, a $C_1$ to $C_{10}$ alkyl group, a $C_1$ to $C_{10}$ alkoxy group, a $C_2$ to $C_{10}$ alkenyl group, a $C_2$ to $C_{10}$ alkynyl group, or a halogen atom; and W is a cinnamylidene group, a (meth)acryloyl group, a (meth)acryloyl group-containing group, a coumarin group, or a benzophenone group.

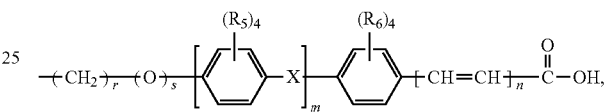

<Formula 2> where r is an integer of 0 to 12; s is 0 or 1; m is 0 or 1; n is an integer of 1 to 3; X is a single bond, a $C_1$ to $C_{10}$ alkylene group, —O—, —S—, —SO—, —SO$_2$—, —CH=CH—, —C≡C—, —N=N—, —COO—, or —OCO—; $R_5$ and $R_6$ are each independently a hydrogen atom, a $C_1$ to $C_{10}$ alkyl group, a $C_1$ to $C_{10}$ alkoxy group, a $C_2$ to $C_{10}$ alkenyl group, a $C_2$ to $C_{10}$ alkynyl group, or a halogen atom.

The liquid crystalline polymer may further include a unit containing no photosensitive group while containing a mesogen formation group. Specifically, the unit may be represented by Formula 3:

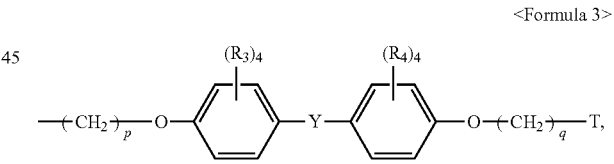

<Formula 3> where p is an integer of 1 to 12; q is an integer of 0 to 12; Y is a single bond, a $C_1$ to $C_{10}$ alkylene group, —O—, —S—, —SO—, —SO2-, —CH=CH—, —C≡C—, —N=N—, —COO—, or —OCO—; $R_3$ and $R_4$ are each independently a hydrogen atom, a $C_1$ to $C_{10}$ alkyl group, a $C_1$ to $C_{10}$ alkoxy group, a $C_2$ to $C_{10}$ alkenyl group, a $C_2$ to $C_{10}$ alkynyl group, or a halogen atom; T is a hydrogen atom, a hydroxyl group, a cyano group, a $C_1$ to $C_{10}$ alkyl group, a $C_2$ to $C_{10}$ alkenyl group, a $C_2$ to $C_{10}$ alkynyl group, a $C_1$ to $C_{10}$ alkoxy group, a halogen atom, or a $C_1$ to $C_{10}$ haloalkyl group.

The liquid crystalline polymer may have at least one of a nematic liquid crystal structure, a smectic liquid crystal structure, and a cholesteric liquid crystal structure. Preferably, the liquid crystalline polymer has the nematic liquid crystal structure. The liquid crystalline polymer may be prepared by a typical method well-known to a person having ordinary knowledge in the art, or may be obtained from commercially available products.

The first retardation layer 100 may be formed by depositing a composition for the first retardation layer including liquid crystals having a photosensitive reaction group onto the UV absorber-containing primer layer 300, followed by drying, irradiation with linearly polarized light, heating, and cooling. After heating the composition subjected to irradiation with the linearly polarized light, the heated composition may be further subjected to alignment of liquid crystals.

The composition for the first retardation layer may be deposited on the UV absorber-containing primer layer 300 without any additional treatment. Alternatively, the surface of the UV absorber-containing primer layer 300 may be subjected to plasma treatment or corona treatment to prevent the UV absorber-containing primer layer 300 from peeling off of the first retardation layer 100 while securing improvement in alignment of the liquid crystals of the first retardation layer 100 through improvement in wettability of the UV absorber-containing primer layer 300. Plasma treatment or corona treatment may be carried out by a typical method well known to those skilled in the art. For example, plasma or corona treatment may be carried out at the total of about 160 doses and may be carried out under conditions of about 20 doses to about 80 doses once to 10 times. Within this range, plasma or corona treatment may be carried out to achieve efficient formation of the first retardation layer without adversely affecting the second retardation layer 200.

The composition for the first retardation layer may be prepared by dissolving the liquid crystals in a solvent. Examples of the solvent may include aliphatic hydrocarbons, such as hexane and the like; aromatic hydrocarbons, such as toluene, xylene, benzene, monochlorobenzene, dichlorobenzene, and the like; halogenated hydrocarbons, such as dichloromethane, dichloroethane, and the like; alicyclic hydrocarbons, such as cyclohexane and the like; ketones, such as acetone, methylethylketone, cyclohexanone, and the like; ethers, such as dioxane, tetrahydrofuran, and the like; and amides, such as dimethylformamide and the like. The composition for the first retardation layer may be deposited on the UV absorber-containing primer layer by a typical method using, for example, a spin coater, a slit coater, a spray coater, a roll coater, and the like.

The composition for the first retardation layer deposited on the UV absorber-containing primer layer is dried. Drying of the deposited composition is performed at a temperature of about 50° C. to about 65° C.

The dried composition is irradiated with linearly polarized light. Irradiation with the linearly polarized light allows only the photosensitive reaction groups of the unit irradiated with the linearly polarized light among the units in the deposited composition to be crosslinked. Irradiation may be performed using UV light, IR (infrared) light, visible light, or the like, preferably UV light having a wavelength of about 200 nm to about 500 nm, more preferably UV light having a wavelength of about 250 nm to about 400 nm.

After irradiation, the deposited composition may be subjected to heating and cooling. In the units, the mesogen formation group is aligned in the normal direction of the second retardation layer to form the first retardation layer in homeotropic alignment. Heating may be performed at about 50° C. to about 150° C., preferably about 60° C. to about 140° C. Cooling may be performed at a cooling rate of about 1° C./min to about 100° C./min, preferably about 1° C./min to 20° C./min.

For fixation of the liquid crystal alignment, the deposited composition may be subjected again to irradiation with light after heating and cooling. For example, the deposited composition may be subjected to irradiation with UV light having a wavelength of about 200 nm to about 500 nm, preferably 250 to 400 nm, to fix the liquid crystal alignment.

The first retardation layer 100 is a retardation layer having a refractive index relationship of nx>nz>ny at a wavelength of 550 nm, wherein nx may range from about 1.5 to about 1.6, ny may range from about 1.4 to about 1.5, and nz may range from about 1.5 to about 1.6. Within these ranges, the first retardation layer can secure optical compensation in an optical display.

The first retardation layer 100 may have a degree of biaxiality NZ of greater than zero to less than 1.0 (0<NZ<1.0), preferably about 0.3 to about 0.7, at a wavelength of 550 nm. Within this range, the first retardation layer 100 can assist in reduction of variation of reflected colors depending upon viewing angle.

The first retardation layer 100 may have an in-plane retardation Re of about 90 nm to about 170 nm, preferably about 90 nm to about 150 nm, more preferably about 100 nm to about 140 nm, at a wavelength of 550 nm. Within this range, the first retardation layer 100 can secure an effect of preventing reflection caused by external light together with the second retardation layer 200, thereby improving screen visibility.

The first retardation layer 100 may have an out-of-plane retardation Rth of about −30 nm to about 30 nm, preferably about −20 nm to about 20 nm, more preferably about −20 nm to about 10 nm, at a wavelength of 550 nm. Within this range, the first retardation layer 100 can secure an effect of preventing reflection caused by external light together with the second retardation layer 200, thereby improving screen visibility.

The first retardation layer 100 may have a thickness of about 3 μm or less, preferably about 2 μm or less. Within this thickness range, the first retardation layer 100 can assist in thickness reduction of a polarizing plate.

Although not shown in FIG. 1, the liquid crystal retardation film may further include an adhesive layer formed on the other surface of the first retardation layer 100 such that the liquid crystal retardation film can be stacked on a panel of an optical display therethrough.

The UV absorber-containing primer layer 300 is formed on one surface of the second retardation layer 200. Herein, the expression "directly formed" means that a certain adhesive layer, bonding layer or adhesive/bonding layer is not interposed between the first retardation layer and the UV absorber-containing primer layer.

The second retardation layer 200 may include a liquid crystal layer that does not exhibit variation in alignment of liquid crystals upon UV irradiation (for example, irradiation at a wavelength of about 200 nm to about 400 nm). As a result, the liquid crystal retardation film can maintain desired phase retardation, since there is no alignment of liquid crystals even without blocking UV light when applied to a polarizing plate. The second retardation layer or a liquid crystal layer included in the second retardation layer may have an in-plane retardation variation (an absolute value of a difference in in-plane retardation before and after exposure) of about 3 nm or less, for example, about 0 nm to about 3 nm, at a wavelength of 550 nm, upon exposure to light in the wavelength range of UV light (for example: a wavelength of about 200 nm to about 400 nm) to visible light using a Q-sun weather-resistance tester (for example, Q-Lab Co., Ltd.). Here, the exposure time may be about 500 hours or less, without being limited thereto.

The second retardation layer 200 may include a liquid crystal layer. The liquid crystal layer may include liquid crystals that do not exhibit variation in alignment of the liquid crystals upon UV irradiation (for example, irradiation at a wavelength of about 200 nm to about 400 nm). The liquid crystal layer realizes phase retardation through an alignment layer, without being limited thereto. The first retardation layer is formed without the alignment layer. Thus, even when the first retardation layer is formed after formation of the UV absorber-containing primer layer on the second retardation layer, it is possible to prevent the second retardation layer from suffering variation in alignment of the liquid crystals due to linearly polarized UV light. When a polymer film is used instead of the liquid crystal layer as the second retardation layer 200, the liquid crystal retardation film can be thickened and only the thickness of the liquid crystal layer can be increased by about 10 times or more, thereby causing increase in the total thickness of an optical display. The alignment layer may include an alignment layer subjected to rubbing treatment using a rubbing agent, an alignment layer formed through photo alignment, and the like, without being limited thereto. The rubbing agent may be selected from typical rubbing agents.

The second retardation layer 200 may be formed by forming an alignment layer on a base film, depositing a composition for the second retardation layer on the alignment layer, followed by heating and curing through irradiation with non-polarized UV light. The base film may include an optically transparent resin film typically used in the art. For example, the base film may include cellulose resins including triacetylcellulose, polyester resins, and polycarbonate films, without being limited thereto.

The second retardation layer 200 is a retardation layer having a refractive index relationship of nx>nz>ny at a wavelength of 550 nm, wherein nx may range from about 1.55 to about 1.65, ny may range from about 1.45 to about 1.55, and nz may range from about 1.55 to about 1.65. Within these ranges, the second retardation layer can secure optical compensation in an optical display.

The second retardation layer 200 may have a degree of biaxiality NZ of greater than zero to less than 1.0 (0<NZ<1.0), preferably about 0 to about 0.5, at a wavelength of 550 nm. Within this range, the second retardation layer 200 can secure good side reflectance viewing angle.

The second retardation layer 200 may have an in-plane retardation Re of about 210 nm to about 280 nm, preferably about 210 nm to about 260 nm, more preferably about 225 nm to about 255 nm, more preferably about 230 nm to about 250 nm. Within this range, the second retardation layer 200 can secure the effect of preventing reflection caused by external light together with the first retardation layer 100, thereby improving screen visibility.

The second retardation layer 200 may have an out-of-plane retardation Rth of about −90 nm to about −140 nm, preferably about −100 nm to about −130 nm, more preferably about −105 nm to about −125 nm, at a wavelength of 550 nm. Within this range, the second retardation layer 200 can secure the effect of preventing reflection caused by external light together with the first retardation layer 100, thereby improving screen visibility.

The liquid crystal layer may have a liquid crystal structure of homeotropic alignment or homogeneous alignment. The liquid crystal layer may include at least one type of nematic liquid crystals, smectic liquid crystals, and discotic liquid crystals, preferably the nematic liquid crystals or the discotic liquid crystals.

The second retardation layer 200 may have a thickness of about 3 μm or less, preferably about 2 μm or less. Within this thickness range, the first retardation layer 100 can assist in thickness reduction of a polarizing plate.

An angle defined between a fast axis of the second retardation layer 200 and a fast axis of the first retardation layer 100 may be about 55° to about 80°, preferably about 60° to about 75°, more preferably about 60° to about 70°. Within this range, the liquid crystal retardation film can exhibit good antireflection characteristics both at the front and the side.

The UV absorber-containing primer layer 300 is directly formed on each of the first retardation layer 100 and the second retardation layer 200. The second retardation layer 200 has a higher crosslinking degree of liquid crystals having the photosensitive group than the first retardation layer 100, thereby reducing adhesive strength between the second retardation layer 200 and the first retardation layer 100. The UV absorber-containing primer layer 300 improves adhesive strength between the first retardation layer 100 and the second retardation layer 200, thereby preventing separation of the first retardation layer 100 from the second retardation layer 200.

Since the UV absorber-containing primer layer 300 contains a UV absorber, the UV absorber-containing primer layer 300 can prevent variation of phase retardation due to distortion of alignment of the liquid crystals in the first retardation layer 100 when the first retardation layer 100 is exposed to UV light. The first retardation layer 100 is formed without the alignment layer and is cured by linearly polarized UV, thereby causing distortion or variation of alignment of the liquid crystals upon UV irradiation. The UV absorber-containing primer layer 300 may have a light transmittance of about 2% or less, preferably about 1.5% or less, more preferably about 1% or less, with respect to light having a wavelength of 380 nm. Within this range, the UV absorber-containing primer layer 300 can prevent distortion or variation of the liquid crystals of the first retardation layer upon UV irradiation.

FIG. 1 shows one example of a UV absorber-containing primer layer as one example of the UV absorbent primer layer. However, a primer layer not containing a UV absorber can be included within the scope of the present invention so long as the primer layer can have a UV absorbent function.

In one embodiment, the liquid crystal retardation film may have a retardation variation rate of about 3% or less, preferably about 1% or less, as calculated by Equation 1. Within this range, the liquid crystal retardation film can have improved reliability with respect to UV light and thus can be used for a light emitting display.

Retardation variation rate=|B−A|/A×100     <Equation 1> wherein A is an initial Re (unit: nm) of the liquid crystal retardation film at a wavelength of 550 nm, and B is an Re (unit: nm) of the liquid crystal retardation film at a wavelength of 550 nm after the second retardation layer of the liquid crystal retardation film is irradiated with UV light at a wavelength of 300 nm to 400 nm for 250 hours.

UV irradiation may be performed using a Q-sun xenon lamp (Q-Lab Co., Ltd.), without being limited thereto. Herein, the "initial Re" means an in-plane retardation Re of the liquid crystal retardation film at a wavelength of 550 nm before irradiation with UV light.

On the other hand, the inventors of the present invention found that the UV absorber-containing primer layer 300 formed between the first retardation layer 100 and the second retardation layer 200 caused a significant decrease in reflectance at the front and the side thereof and reduced a difference in reflectance between front reflectance and side reflectance. The primer layer serves to improve coating uniformity, thereby improving uniformity of reflectance. In addition, reflectance at the front and the side thereof can be reduced, thereby improving screen quality. A polarizing plate including the liquid crystal retardation film according to the present invention may have a front reflectance of about 1% or less, preferably about 0.7% or less, at the front thereof. The polarizing plate including the liquid crystal retardation film according to the present invention may have a front reflectance of about 1% or less, preferably about 0.9% or less, at the side thereof. Within this range, the polarizing plate can have improved screen quality. A difference between front reflectance and side reflectance may be about 0.3% or less. Within this range, the difference between front reflectance and side reflectance can be reduced, thereby improving screen quality regardless of a location at which a user watches a screen of a light emitting display.

The UV absorber may have a maximum absorption wavelength of about 400 nm or less, preferably about 360 nm to about 390 nm, more preferably about 360 nm to about 380 nm. Within this range, the UV absorber can prevent distortion of alignment of the liquid crystals in the first retardation layer 100, thereby improving reliability. Herein, the "maximum absorption wavelength" refers to a wavelength at which the maximum absorption peak appears, that is, a wavelength corresponding to the maximum absorbance on a wavelength-dependent absorbance curve. Here, "absorbance" may be measured by a typical method known to those skilled in the art. For example, the UV absorber may include at least one of a triazole-based UV absorber including a benzotriazole-based UV absorber, a hydroxyphenyltriazine-based UV absorber, a triazine-based UV absorber, and a phenyltriazine-based UV absorber, without being limited thereto.

The UV absorber may be present in an amount of about 10 wt % to about 30 wt/o in the UV absorber-containing primer layer. Within this range, the UV absorber can block transmission of UV light into the first retardation layer. Preferably, the UV absorber is present in an amount of about 15 wt % to about 25 wt %. Within this range, the UV absorber can block transmission of UV light into the first retardation layer and can be prevented from being participated from the primer layer.

The UV absorber-containing primer layer 300 may have an index of refraction of about 1.48 to about 1.65, preferably about 1.55 to about 1.65. Within this range, the UV absorber-containing primer layer 300 can prevent deterioration in transmittance and light scattering by matching the indices of refraction between the first retardation layer and the second retardation layer even when the UV absorber-containing primer layer 300 is formed between the first liquid crystal layer and the second liquid crystal layer.

The UV absorber-containing primer layer 300 may have a thickness of about 5 μm or less, preferably about 3 μm or less. Within this thickness range, the UV absorber-containing primer layer 300 can provide a polarizing plate having a slim structure and can sufficiently suppress influence of UV light on the first retardation layer even when containing the UV absorber.

The UV absorber-containing primer layer 300 is non-adhesive. In order to secure high adhesive strength to both the first retardation layer 100 and the second retardation layer 200 having different degrees of crosslinking, the UV absorber-containing primer layer 300 may be formed of a composition comprising at least one of an acrylic resin, a urethane resin and a urethane (meth)acrylate resin, and the UV absorber. The composition may further comprise a heat initiator to further improve mechanical strength of the UV absorber-containing primer layer.

The liquid crystal retardation film may have a thickness of about 1 μm to about 5 μm, preferably about 1 μm to about 3 μm. Within this thickness range, the liquid crystal retardation film can be used for a polarizing plate for light emitting displays.

The liquid crystal retardation film may have a total light transmittance of about 90% or more and a haze of about 1% or less in the wavelength range of visible light. Within this range, the liquid crystal retardation film can be used for a polarizing plate for light emitting displays.

Next, a liquid crystal retardation film according to another embodiment of the present invention will be described with reference to FIG. 2. FIG. 2 is a sectional view of a liquid crystal retardation film according to another embodiment of the present invention.

Referring to FIG. 2, a liquid crystal retardation film 20 is substantially the same as the liquid crystal retardation film 10 according to the above embodiment except that a base film 350 is further formed on the other surface of the second retardation layer 200.

The base film 350 is formed on the other surface of the second retardation layer 200 to facilitate formation of an alignment layer for formation of the second retardation layer and to protect the liquid crystal retardation film. The base film may include a typical polymer film. For example, the base film may be formed of a polyester film, such as a polyethylene terephthalate and the like, and a polycarbonate film, without being limited thereto. The base film 350 may be subjected to release treatment to facilitate separation from the second retardation layer.

Next, a polarizing plate according to one embodiment of the present invention will be described with reference to FIG. 3. FIG. 3 is a sectional view of a polarizing plate according to one embodiment of the present invention.

Referring to FIG. 3, a polarizing plate 30 includes a polarizing film 400 and a liquid crystal retardation film, which may include the liquid crystal retardation film according to the embodiments of the present invention. With the liquid crystal retardation film according to the present invention, the polarizing plate can secure high adhesive strength between the first liquid crystal layer and the second liquid crystal layer even after UV irradiation for a long period of time, can have a low retardation variation rate to improve reliability in light resistance, can reduce reflectance at the front and the side thereof, and can improve polarization ellipticity.

The polarizing film 400 may be stacked on the other surface of the second retardation layer 200 in the liquid crystal retardation film. Although not shown in FIG. 3, the polarizing film 400 may be stacked on the second retardation layer 200 via an adhesive layer or a bonding layer. The adhesive layer and the bonding layer may be formed of typical adhesives such as a pressure sensitive adhesive, a photocurable adhesive, and a thermosetting adhesive, without being limited thereto.

FIG. 4 is a diagram showing angles defined between the absorption axis of the polarizing film, the fast axis of the second retardation layer, and the fast axis of the first retardation layer. Referring to FIG. 4, the angle defined between the fast axis 100a of the first retardation layer 100 and the absorption axis 400a of the polarizing film 400 may range from about 70° to about 100°, preferably about 75° to about 95°, more preferably about 75° to about 85°. Within this range, the polarizing plate can exhibit good antireflection characteristics both at the front and the side thereof. The angle defined between the fast axis 200a of the second retardation layer 200 and the absorption axis 400a of the polarizing film 400 may range from about 10° to about 25°, preferably about 10° to about 20°. Within this range, the polarizing plate can exhibit good antireflection characteristics both at the front and the side thereof.

The polarizing film 400 is formed on the other surface of the second retardation layer 200 to provide an antireflection effect by transmitting external light to the second retardation layer 200 through linear polarization of the external light.

The polarizing plate 30 may have a front reflectance of about 1% or less, preferably about 0.7% or less. The polarizing plate 30 may have a front reflectance of about 1% or less, preferably about 0.9% or less. Within this range, the polarizing plate can improve screen quality.

In one embodiment, the polarizing film 400 may include a polyvinyl alcohol-based polarizer obtained by uniaxially dyeing a polyvinyl alcohol film with iodine, or a polyene-based polarizer obtained by dehydrating the polyvinyl alcohol film. The polarizer 400 may have a thickness of about 5 µm to about 50 µm. Within this thickness range, the polarizer can be used for a light emitting display.

In another embodiment, the polarizing film may include the polarizer as described above and a protective layer formed on at least one surface of the polarizer. The protective layer may include at least one of an optically transparent protective film or an optically transparent protective coating layer.

The protective film may be formed of an optically transparent resin. The protective film may be formed through melting and extrusion of the resin. The resin may be further subjected to stretching, as needed. The optically transparent resin may include at least one selected from among cellulose esters including triacetyl cellulose (TAC), cyclic polyolefin resins including amorphous cyclic olefin polymer (COP), polycarbonate resins, polyester resins including polyethylene terephthalate (PET), polyethersulfone resins, polysulfone resins, polyamide resins, polyimide resins, non-cyclic polyolefin resins, polyacrylate resins including poly(methyl methacrylate), polyvinyl alcohol resins, polyvinyl chloride resins, and polyvinylidene chloride resins.

The protective coating layer can secure high adhesive strength with respect to the polarizer and can improve transparency, mechanical strength, thermal stability, waterproofness, and durability of the polarizing plate. In one embodiment, the protective coating layer may be formed of an actinic radiation-curable resin composition including an actinic radiation-curable compound and a polymerization initiator. The actinic radiation-curable compound may include at least one of a cationic polymerizable curable compound, a radical polymerizable curable compound, a urethane resin, and a silicone resin. The cationic polymerizable curable compound may include an epoxy compound having at least one epoxy group per molecule, or an oxetane compound having at least one oxetane ring per molecule. The radical polymerizable curable compound may include a (meth)acrylic compound having at least one (meth)acryloyloxy group per molecule. The protective layer may have a thickness of about 5 µm to about 200 µm, specifically about 30 µm to about 120 µm. When the protective layer is a protective film, the protective layer may have a thickness of about 50 µm to about 100 µm, and when the protective layer is a protective coating layer, the protective layer may have a thickness of about 5 µm to about 50 µm. Within this thickness range, the protective layer can be used for a light emitting display. The polarizing plate may further include functional coating layers, for example, a hardcoating layer, an anti-fingerprint layer, and an anti-reflection layer, on one or both surfaces of the protective layer.

A light emitting display according to the present invention may include the polarizing plate for light emitting displays. The light emitting display may include light emitting diodes. The light emitting diode may include organic or organic/inorganic light emitting diodes and may refer to a device including a light emitting diode (LED), an organic light emitting diode (OLED), a quantum dot light emitting diode (QLED), or a light emitting material, such as a phosphor and the like. For example, the light emitting display may include an organic light emitting diode display.

Next, the present invention will be described in more detail with reference to some examples. However, it should be understood that these examples are provided for illustration only and are not to be construed in any way as limiting the present invention.

Example 1

For a second retardation layer, a liquid crystal retardation film (QLAA218, Fuji Film Co., Ltd.) was used. The liquid crystal retardation film (QLAA218) included a liquid crystal retardation layer on one surface of a TAC film (non-retardation film). The liquid crystal retardation layer had an in-plane retardation Re of 240 nm, an out-of-plane retardation Rth of −108 nm, and a degree of biaxiality NZ of 0.04 at a wavelength of 550 nm and included discotic liquid crystals aligned in the hometropic alignment. The liquid crystal retardation layer did not undergo variation of liquid crystals by UV irradiation (wavelength of 200 to 400 nm).

For a UV absorber-containing primer layer, a urethane acrylate resin (UR5562, Electrolube Co., Ltd.) was used. A composition for the UV absorber-containing primer layer was prepared by mixing the urethane acrylate resin (UR5562) with a UV absorber as listed in Table 1 and a heat initiator (UR5562-hardner).

The composition for the UV absorber-containing primer layer was deposited to a predetermined thickness on the other surface of the liquid crystal retardation layer (not adjoining the TAC film), followed by drying and heat curing, thereby forming the UV absorber-containing primer layer.

A composition for a first retardation layer was deposited on one surface of the UV absorber-containing primer layer. The composition for the first retardation layer was prepared by dissolving a liquid crystalline polymer (MHZC-100A, Hayashi Telempu Co., Ltd.) in tetrahydrofuran (THF).

The resulting product was dried at 60° C. Next, the dried resulting product was irradiated with linearly polarized UV light at 300 mJ by allowing UV light emitted from an LED lamp (600 W) to pass through a wire grid polarizer (WGP). After irradiation with the polarized UV light, the resulting product was heated to 130° C. and cooled. Then, a liquid crystal retardation film was fabricated by irradiating the resulting product with UV light emitted from a high pressure mercury lamp (3 kW) to form a first retardation layer.

The first retardation layer had an in-plane retardation Re of 115 nm, an out-of-plane retardation Rth of −17 nm, and a degree of biaxiality NZ of 0.35 at a wavelength of 550 nm, included nematic liquid crystals aligned in the hometropic alignment, and had a thickness of 2.0 µm. An angle between the fast axis of the first retardation layer and the fast axis of the second retardation layer was set to 650.

A polarizer was fabricated by stretching a polyvinyl alcohol film at 60° C. to three times an initial length thereof, dyeing the stretched polyvinyl alcohol film with iodine, and stretching the dyed polyvinyl alcohol film in a boric acid solution at 40° C. to 2.5 times the length of the dyed polyvinyl alcohol film. As a first protective layer, a triacetylcellulose film (ZRG40SL, Fuji Film Co., Ltd.) was bonded to one surface of the polarizer via an epoxy UV bonding agent for polarizing plates. Then, a triacetylcellulose film (ZRG40SL, Fuji Film Co., Ltd.) was bonded to the other surface of the polarizer via the epoxy UV bonding agent for polarizing plates, thereby fabricating a polarizing film.

A polarizing plate was fabricated by attaching the TAC film of the second retardation layer to one surface of the polarizing film via the adhesive layer.

Examples 2 to 5

Liquid crystal retardation films and polarizing plates were prepared in the same manner as in Example 1 except that different resins and UV absorbers were used as listed in Table 1.

Comparative Example 1

A liquid crystal retardation film and a polarizing plate were prepared in the same manner as in Example 1 except that the first retardation film was formed on the second retardation layer by coating without forming the UV absorber-containing primer layer between the first retardation layer and the second retardation layer.

Comparative Example 2

A liquid crystal retardation film and a polarizing plate were prepared in the same manner as in Example 1 except that a primer layer did not include a UV absorber.

Comparative Example 3

A composition for adhesive layers was prepared by mixing 72 parts by weight of an acrylic resin, 8 parts by weight of an isocyanate-based crosslinking agent, and 20 parts by weight of benzotriazole as an UV absorber. A liquid crystal retardation film and a polarizing plate were prepared in the same manner as in Example 1 except that an adhesive layer (thickness: 25 μm) was formed using the composition for adhesive layers instead of using the UV absorber-containing primer layer.

In each of the polarizing plates prepared in Examples and Comparative Examples, the angle between the absorption axis of the polarizer in the polarizing film and the fast axis of the second retardation layer was set to 18°. The angle between the absorption axis of the polarizer in the polarizing film and the fast axis of the first retardation layer was set to 78°.

The UV absorber-containing primer layers, the liquid crystal retardation films, and the polarizing plates prepared in Examples and Comparative Examples were evaluated as to the following properties and evaluation results are shown in Tables 1 and 2.

Property Evaluation (1) Light transmittance of UV absorber-containing primer layer: Light transmittance of each of the UV absorber-containing primer layers prepared in Examples and Comparative Examples was measured using a Perkin Elmer Lambda 1050 UV-VIS spectrometer at a wavelength of 380 nm.

(2) Total light transmittance: Total light transmittance of each of the liquid crystal retardation films was measured using a Perkin Elmer Lambda 1050 UV-VIS spectrometer at a wavelength of 550 nm.

(3) Adhesive strength (Cross-cut evaluation): For each of the liquid crystal retardation films prepared in Examples and Comparative Examples, adhesive strength between the first retardation layer, the UV absorber-containing primer layer, and the second retardation layer was evaluated. A specimen of each liquid crystal retardation film having a size of 10 cm×10 cm (length×width) was cut to a total of 100 fragments composed of 10×10 fragments (length×width) from the first retardation layer to an interface between the base and the second retardation layer. An adhesive tape was attached to one surface of the first retardation layer and then removed therefrom. The number of fragments not separated from the first retardation layer was counted. A greater number of fragments remaining on the first retardation layer indicates better adhesive strength.

(4) Reliability Evaluation 1 upon UV irradiation: Each of the liquid crystal retardation films was irradiated with UV light at a wavelength of 300 nm to 400 nm (simulated sunlight) using a Q-sun (Q-Lab co., Ltd.) for 250 hours. Particularly, the second retardation layer of the liquid crystal retardation film was subjected to UV irradiation. Separation of the first retardation layer from the UV absorber-containing primer layer was evaluated. Evaluation was performed by the same method as in (3).

(5) Reliability Evaluation 2 upon UV irradiation: Each of the liquid crystal retardation films prepared in Examples and Comparative Examples was irradiated with UV light at a wavelength of 300 nm to 400 nm (simulated sunlight) using a Q-sun (Q-Lab) for 250 hours. Particularly, the second retardation layer of the liquid crystal retardation film was subjected to UV irradiation. Re values at a wavelength of 550 nm before and after irradiation with UV light were measured and the retardation variation rate was calculated by Equation 1.

(6) Reflectance: With an adhesive layer attached to the other surface of the first layer of each of the polarizing plates prepared in Examples and Comparative Examples, the polarizing plate was stacked on a reflective panel via the adhesive layer to prepare a specimen. Front reflectance was measured using a spectrophotometer (CM-3600D, Konica Minolta Co., Ltd.) with a light source D65 under condition of a light reception unit at 100. Side reflectance was measured using a DMS (Instrument Systems Co., Ltd.).

TABLE 1

| | | Example 1 | Example 2 | Example 3 | Example 4 | Example 5 |
|---|---|---|---|---|---|---|
| Primer layer | Resin | Resin 1 | Resin 2 | Resin 2 | Resin 2 | Resin 3 |
| | Index of refraction of resin | 1.48 | 1.5 | 1.5 | 1.5 | 1.6 |

TABLE 1-continued

|  |  | Example 1 | Example 2 | Example 3 | Example 4 | Example 5 |
|---|---|---|---|---|---|---|
|  | UV absorber | Benzotriazole 1 | Benzotriazole 2 | Hydroxyphenyl triazine | Benzotriazole 1 + Hydroxyphenyl triazine | Benzotriazole 1 |
|  | Content of UV absorber (wt %) | 15 | 20 | 25 | 20 (each 10) | 20 |
|  | Thickness (μm) | 3 | 3 | 3 |  |  |
|  | Transmittance @380 nm(%) | 0.67 | 0.72 | 0.02 | 0.34 | 0.67 |
| Transmittance@550 nm (%) |  | 87.24 | 88.47 | 90.38 | 90.4 | 90.23 |
| Adhesive strength |  | 95/100 | 97/100 | 95/100 | 97/100 | 98/100 |
| Reliability Evaluation 1 |  | 98/100 | 97/100 | 95/100 | 100/100 | 99/100 |
| Reliability Evaluation 2 (%) |  | 0.7 | 0.5 | 0.6 | 0.3 | 0.8 |
| Reflectance (%) | Front | 0.64 | 0.62 | 0.6 | 0.61 | 0.61 |
|  | Side | 0.81 | 0.8 | 0.82 | 0.84 | 0.84 |
|  | Reflectance difference | 0.17 | 0.18 | 0.22 | 0.23 | 0.23 |

TABLE 2

|  |  | Comparative Example 1 | Comparative Example 2 | Comparative Example 3 |
|---|---|---|---|---|
| Primer layer | Resin | — | Resin 2 | — |
|  | Index of refraction of resin | — | 1.493 | — |
|  | UV absorber | — | — |  |
|  | Thickness (μm) | — | 3 | — |
|  | Transmittance @380 nm(%) | — | 25.3 | — |
| Adhesive layer |  |  |  | Included |
| Content of UV absorber in adhesive layer (wt %) |  | — | — | 20 |
| Transmittance@550 nm (%) |  | 91.24 | 90.24 | 3.60 |
| Adhesive strength |  | 15/100 | 95/100 | 100/100 |
| Reliability Evaluation 1 |  | 0/100 | 94/100 | 100/100 |
| Reliability Evaluation 2 (%) |  | 18 | 16 | 10 |
| Reflectance (%) | Front | Unmeasurable | 1.28 | 1.08 |
|  | Side | Unmeasurable | 1.75 | 1.57 |
|  | Reflectance difference | — | 0.47 | 0.49 |

*Resin 1: UR5562 (Electrolube Co., Ltd.)
*Resin 2: CN 9006 (Sartomer Co., Ltd.)
*Resin 3: MPV (Aromatic vinyl) (Sumitomoseik Co., Ltd.)
*Benzotriazole 1: Tinuvin384-2 (Basf Co., Ltd.), maximum absorption wavelength: 365 nm
*Benzotriazole 2: Tinuvin900 (Basf Co., Ltd.), maximum absorption wavelength: 365 nm
*Hydroxyphenyl triazine: Tinuvin477 (Basf Co., Ltd.), maximum absorption wavelength: 360 nm As shown in Table 1, the liquid crystal retardation films and the polarizing plates according to the present invention exhibited high adhesive strength between the second liquid crystal layer and the first liquid crystal layer and high adhesive strength between the first liquid crystal layer and the second liquid crystal layer even after UV irradiation for a long period of time, could improve reliability in light resistance by securing a low retardation variation rate, could reduce reflectance at the front and the side thereof, and had a low difference between front reflectance and side reflectance.

Conversely, the liquid crystal retardation film of Comparative Example 1 or 2, which did not include the UV absorber-containing primer layer or included the primer layer not containing the UV absorber, exhibited poor adhesive strength or poor reliability evaluation results, and had high reflectance values at the front and the side thereof. In addition, the liquid crystal retardation film of Comparative Example 3, which included the adhesive layer containing the UV absorber instead of the UV absorber-containing primer layer, had a high retardation variation rate and higher reflectance values at the front and the side thereof, despite exhibiting adhesive strength even upon UV irradiation.

It should be understood that various modifications, changes, alterations, and equivalent embodiments can be made by those skilled in the art without departing from the spirit and scope of the invention.

The invention claimed is:

1. A liquid crystal retardation film comprising:
   a first retardation layer having no alignment layer, a UV absorbent primer layer, and a second retardation layer sequentially stacked in the stated order,
   wherein each of the first retardation layer and the second retardation layer is a liquid crystal layer,
   wherein the liquid crystal retardation film has a retardation variation rate of about 3% or less, as calculated by Equation 1:

Retardation variation rate=$|B-A|/A \times 100$, where A is an initial Re (unit: nm) of the liquid crystal retardation film at a wavelength of 550 nm; and B is an Re (unit: nm) of the liquid crystal retardation film at a wavelength of 550 nm after the second retardation layer of the liquid crystal retardation film is irradiated with UV light at a wavelength of 300 nm to 400 nm for 250 hours, wherein the first retardation layer comprises a crosslinked product of liquid crystals having photosensitive groups and only photosensitive groups irradiated with a linearly polarized light are crosslinked.

2. The liquid crystal retardation film according to claim 1, wherein the UV absorbent primer layer comprises a UV absorber-containing primer layer.

3. The liquid crystal retardation film according to claim 1, wherein the UV absorbent primer layer is directly formed on each of the first retardation layer and the second retardation layer.

4. The liquid crystal retardation film according to claim 1, wherein the liquid crystal layer of the second retardation layer comprises a liquid crystal layer comprising liquid crystals having a photosensitive reaction group.

5. The liquid crystal retardation film according to claim 1, wherein the second retardation layer has a higher crosslinking degree of liquid crystals having a photosensitive reaction group than the first retardation layer.

6. The liquid crystal retardation film according to claim 1, wherein the first retardation layer has an in-plane retardation Re of about 90 nm to about 170 nm at a wavelength of 550 nm and the second retardation layer has an in-plane retardation Re of about 210 nm to about 280 nm at a wavelength of 550 nm.

7. The liquid crystal retardation film according to claim 1, wherein an angle defined between a fast axis of the second retardation layer and a fast axis of the first retardation layer ranges from about 55° to about 80°.

8. The liquid crystal retardation film according to claim 1, wherein liquid crystals of the first retardation layer are nematic liquid crystals aligned in homeotropic alignment.

9. The liquid crystal retardation film according to claim 1, wherein liquid crystals of the second retardation layer are discotic liquid crystals or nematic liquid crystals aligned in homeotropic alignment.

10. The liquid crystal retardation film according to claim 2, wherein the UV absorber comprises at least one selected from the group consisting of benzotriazole, hydroxyphenyltriazine, triazine, and phenyltriazine based UV absorbers.

11. The liquid crystal retardation film according to claim 1, wherein the UV absorbent primer layer has a thickness of about 5 μm or less.

12. The liquid crystal retardation film according to claim 2, wherein the UV absorber is present in an amount of about 10 wt % to about 30 wt % in the UV absorber-containing primer layer.

13. The liquid crystal retardation film according to claim 1, wherein each of the liquid crystal layers of the first and second retardation layers comprises a photosensitive group, comprising at least one selected from the group consisting of a cinnamoyl group, a cinnamylidene group, a (meth)acryloyl group, a (meth)acryloyl group-containing group, a coumarin group, and a benzophenone group.

14. The liquid crystal retardation film according to claim 2, wherein the UV absorbent primer layer is non-adhesive.

15. The liquid crystal retardation film according to claim 1, wherein the liquid crystal layer of the second retardation layer comprises liquid crystals having an alignment not changed by UV irradiation.

16. A polarizing plate for light emitting displays, comprising:
a polarizing film; and
the liquid crystal retardation film according to claim 1, the liquid crystal retardation film being formed on one surface of the polarizing film.

17. The polarizing plate for light emitting displays according to claim 16, wherein the polarizing film, the second retardation layer, the UV absorbent primer layer, and the first retardation layer are sequentially stacked in the stated order in the polarizing plate.

18. The polarizing plate for light emitting displays according to claim 16, wherein an angle defined between a fast axis of the first retardation layer and an absorption axis of the polarizing film ranges from about 70° to about 100° and an angle defined between a fast axis of the second retardation layer and the absorption axis of the polarizing film ranges from about 10° to about 25°.

19. The polarizing plate for light emitting displays according to claim 16, wherein the polarizing plate has a front reflectance of about 1% or less and a side reflectance of about 1% or less, as measured on the polarizing film.

20. A light emitting display comprising the polarizing plate for light emitting displays according to claim 16.

* * * * *